United States Patent [19]

Grüter

[11] 4,241,422
[45] Dec. 23, 1980

[54] SERIES-PARALLEL-SERIES CHARGE TRANSFER MEMORY HAVING COMPLETE BIAS CHARGE OPERATION

[75] Inventor: Otto Grüter, Krailling, Fed. Rep. of Germany

[73] Assignee: Siemens Aktiengesellschaft, Berlin & Munich, Fed. Rep. of Germany

[21] Appl. No.: 61,271

[22] Filed: Jul. 27, 1979

[30] Foreign Application Priority Data

Oct. 2, 1978 [DE] Fed. Rep. of Germany ....... 2842856

[51] Int. Cl.³ ............................................. G11C 11/34
[52] U.S. Cl. ...................................... 365/183; 357/24; 365/238
[58] Field of Search ........................ 365/238, 219, 183; 357/24; 307/221 C

[56] References Cited

U.S. PATENT DOCUMENTS

| | | | |
|---|---|---|---|
| 3,660,697 | 5/1972 | Berglund et al. | 357/24 |
| 4,103,347 | 7/1978 | Barton | 365/183 |

OTHER PUBLICATIONS

Sequin et al., "Charge Transfer Devices", Academic Press, New York, San Francisco, London, 1975, pp. 97–109.

*Primary Examiner*—Stuart N. Hecker
*Attorney, Agent, or Firm*—Hill, Van Santen, Steadman, Chiara & Simpson

[57] ABSTRACT

A charge transfer memory has a read-in chain, and assigned parallel chain and a read-out chain, each consisting of charge transfer elements. An additional parallel chain of charge transfer elements stores bias charges which are fed into the read-in chain, after the transfer of information charges from the read-in chain into the parallel chain, before a renewed serial input of information charges into the read-in chain. The read-out chain has a circuit arrangement assigned thereto which fills the output chain with bias charges upon the serial read-out of charges which characterize the information. The read-out chain has assigned thereto a further parallel chain of charge transfer elements with which the bias charges are removed from the output chain before the renewed delivery of charges characterizing information from the parallel chain.

5 Claims, 8 Drawing Figures

SERIES-PARALLEL-SERIES CHARGE TRANSFER MEMORY HAVING COMPLETE BIAS CHARGE OPERATION

BACKGROUND OF THE INVENTION

1. Field of the Invention

The present invention relates to a charge transfer memory constructed with series-parallel-series organization and having a bias charge operation, in which a read-in chain is provided and comprises first and second charge transfer elements alternately arranged behind one another, and in which the read-in chain has a field of parallel chains having charge transfer elements assigned thereto, into which the charges characterizing the information are transferred from the read-in chain by way of transfer electrodes and in which a read-out chain is provided, comprising first and second charge transfer elements alternately arranged behind one another, into which the charges are delivered from the parallel chains by way of delivery electrodes.

2. Description of the Prior Art

A bias charge operation in charge transfer memories is known in the art. Therefore, a bias charge operation in surface charge transfer memories for reducing the harmful influences which the surface conditions exert on the conduction of the signal is described in the book by Sequin & Tompsett, "Charge Transfer Devices", Academic Press, New York, San Francisco, London, 1975, pp. 97-109.

In charge transfer memories, one attempts to prevent the emptying of the surface conditions for movable charge carriers with the assistance of bias charge operation. In particular, upon shifting so-called empty potential wells which are in a state of thermodynamic inequilibrium, the surface conditions change and emit charges to the potential wells so that the potential wells gradually fill in an undesired manner. This leads to the fact that, given a possible subsequent passage of filled charge wells, these are accordingly emptied, because the original surface conditions again fill when charges are offered and, therefore, remove charges from the potential wells.

A bias charge operation, for example, is necessary in charge transfer modules with surface charge transfer devices (CCDs) in double silicon technology, in order to assure that, for example, in two-phase operation, only the intermediate storage locations are respectively empty, not, however, also the storage locations which carry the information "0", i.e. those which are not filled with an information charge.

In such memory modules, an input circuit is provided which feeds the bias charges into the actual memory chain, together with the information charges. In this manner, however, only the bias charge operation is taken of which is along the actual information flow path, which means that all channels of a parallel field within a series-parallel-series arrangement are always filled with at least the bias charge.

If, in series-parallel-series charge transfer memories, the serially read-in information charges of the input serial chain are transferred into the parallel field, then the input serial chain is first completely without charges upon this transfer. Only subsequently is it again gradually filled proceeding from the input circuit. This leads to the fact that the read-in information charge packets are harmfully reduced by means of the partially emptied surface conditions.

An analogous case is true for the output serial chain of charge transfer memories in series-parallel-series organization. After the delivery of the information charges from the parallel field into the output serial chain, the latter is increasingly emptied upon the flow of the information charges into the output circuit. Directly before the next delivery process, all charge transfer elements of the output serial chain are completely evacuated. Stemming from the surface conditions, the empty charge transfer elements increasingly fill in the direction of the output circuit with harmful interference charges. Therefore, surface conditions become free in the opposite direction, whereby both processes have a disruptive effect on the information charges to be newly delivered from the parallel field.

The charges locally near the output circuit are intolerably increased by means of the interference charges collected. The charges distant from the output circuit are untolerably reduced by means of the refilling of the empty surface conditions. There therefore occurs an unallowably large charge difference, particularly between the first information charge and the last information charge of two successive delivery processes.

SUMMARY OF THE INVENTION

The object of the present invention is to provide a charge transfer memory, having a series-parallel-series organization, with bias charge operation which renders possible a complete bias charge operation both in the parallel chains as well as in the serial input and output chains.

The above object is achieved, according to the present invention, in that the read-in chain has assigned thereto a chain of charge transfer elements storing bias charges, which chain feeds the bias charges into the read-in chain after the transfer of the charges characterizing information from the read-in chain into the parallel chains before a renewed serial input of information charges into the read-in chain; and in that the output chain has allocated thereto a circuit arrangement which, upon serial read-out of the charges characterizing the information from the output chain, fills the output chain with bias charges; and in that the output chain has allocated thereto a further chain of charge transfer elements with which the bias charges are emptied from the output chain before a renewed delivery of the charge characterizing the information from the parallel chains into the output chain.

By means of the present invention, significant error possibilities and limitations of the working range of series-parallel-series charge transfer memories are eliminated, particularly in surface CCDs. Bias charges provided in accordance with the present invention for the input and output serial chains do not mix with the signal charges. Thereby, the dimensioning is not critical. The only requirement is that its amount of charge is smaller than the maximum amount of charge in a charge transfer element. The bias charges only serve to maintain the charge transfer elements charge-free within the serial input and output chains. The evaluation of the signal charges in the output circuit is not rendered more difficult by means of the new bias charges. Moreover, no additional, new control clock pulse is required.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
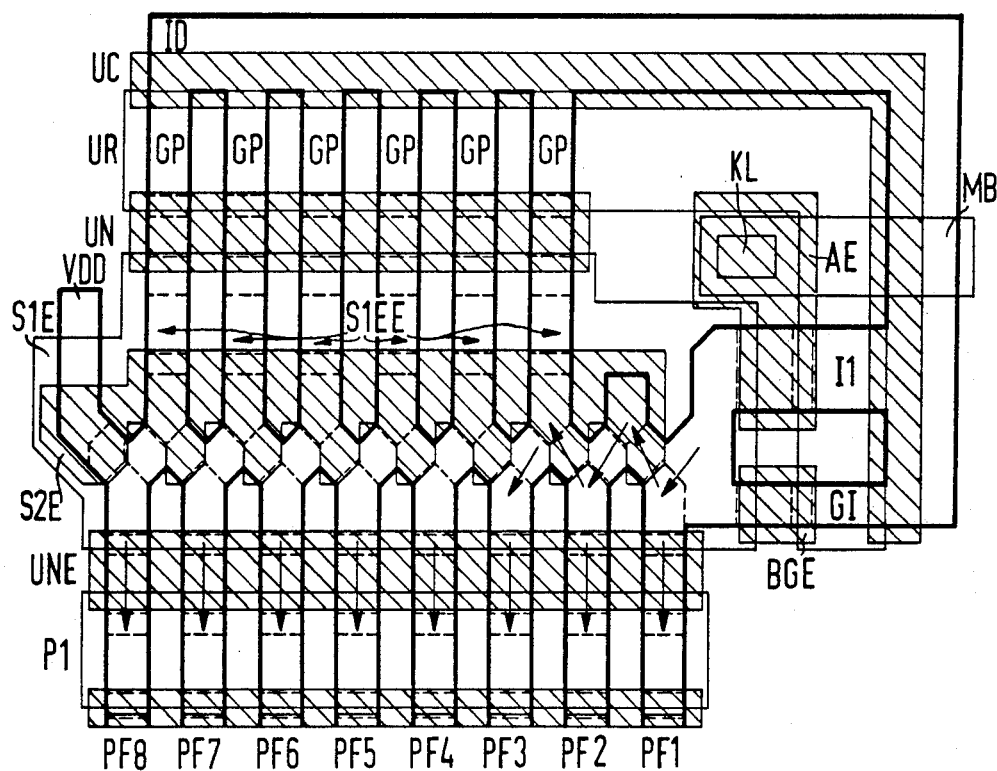
FIG. 1 is a schematic illustration of the design of an input serial chain for a charge transfer memory having implanted transfer areas in series-parallel-series organization with a bias charge operation.
Figure 2:
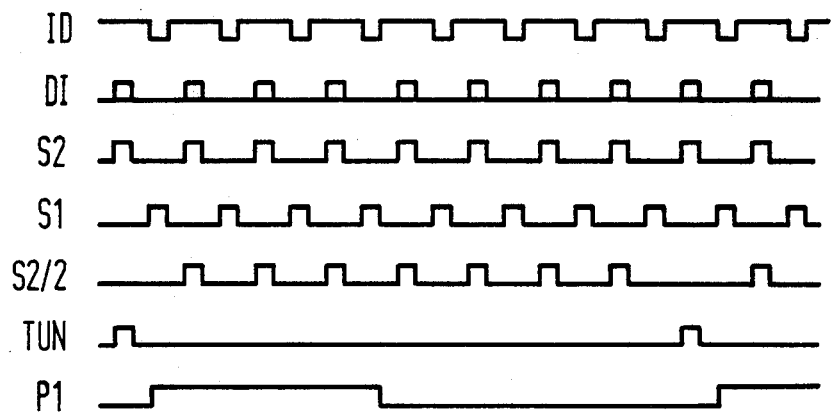
FIG. 2 is a pulse diagram for the operation of the serial input chain of FIG. 1.
Figure 3:
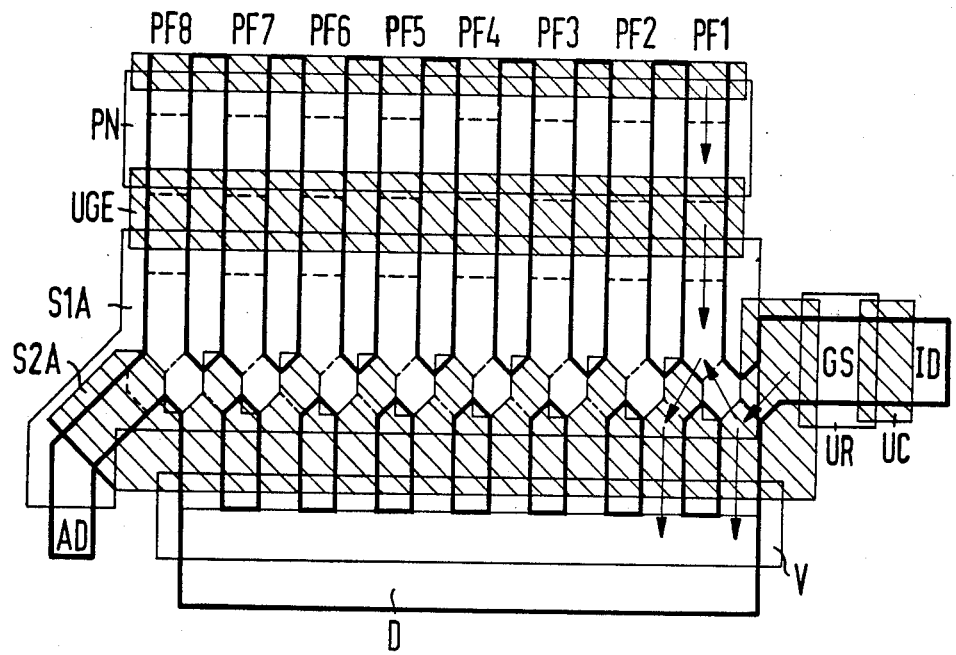
FIG. 3 is a schematic illustration of the design of an output serial chain for a charge transfer memory having implanted transfer areas in series-parallel-series organization and with a bias charge operation.
Figure 4:
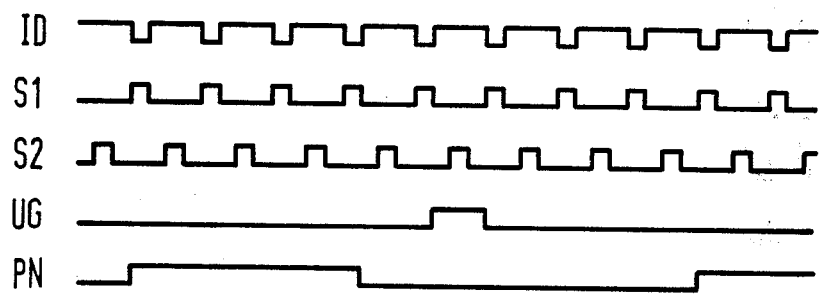
FIG. 4 is a pulse diagram for the operation of the output series chain.

In the designs for the input and output serial chains illustrated in FIGS. 1 and 3, with the appertaining pulse diagrams of FIGS. 2 and 4, it is a matter of serial chain for a series-parallel-series arrangement for two-phase operation with n-channel surface CCDs having implanted transfer areas. Thereby, the shift and storage electrodes are defined as charge transfer elements. The actual serial chains are constructed in a manner technologically known, whereby the thick lines represent the boundaries between thick and thin oxide. The areas with left-hand shading designate the areas having polysilicon-1, and those areas surrounded with thin lines designate areas with polysilicon-2. A contact hole KL provides connection to a metal path MB. The implanted transfer areas are surrounded by broken lines. The scale of the entire arrangement amounts to approximately 2000:1.

In the illustrated pulse diagrams for the assigned electrodes, the time axis extends from left to right; the ordinates in the individual pulse diagrams designate the control voltages.

In order to simplify the illustration, a single parallel field of only eight channels PF1—PF8 is illustrated. In accordance with the illustrated arrows, the charge path in the serial chains proceeds from right to left, whereby the charge flow in the serial chains themselves is formed in a zig-zag pattern. It is thereby achieved that each second charge transfer element is accessible from the outside.

The input serial chain of FIG. 1 is operated in the following manner. The potential wells under the electrode UR are uniformly filled from a diffusion area ID with an appertaining electrode UC by means of constant pulsing of the diffusion area with a clock pulse ID at the time of the clock pulse S1. The information charges IL and bias charges GI are dimensioned by means of the magnitude of the storage areas of the electrode UR. The total information charge, therefore, is composed of the bias charge GI and the actual information charge IL. The bias charge areas GP of the electrode UR dimension the bias charges GP which are supplied, according to the present invention, to the serial chain, which consist of the electrodes S2E (polysilicon-1) and the electrodes S1E (polysilicon-2).

Upon reading in an information DI, for example, a "1", by way of the metal path MB, the contact hole KL and the control electrode AE, the control electrode AE is charged with the information DI. At the same time, the electrode is driven with the clock pulse S2 to input the bias charge BGE. Also at the same time, therefore, there occurs, for example, at the beginning of an input cycle with the clock pulse TUN, the transfer of information stored in the S1E electrodes of the serial chain from the pre-cycle into the transfer electrodes UNE of the parallel chains and the parallel input of the bias charges from the electrodes GP into the electrodes UN which are assigned to the electrodes S1EE of the chain of charge transfer elements which are preconnected to the input serial chain. The clock pulse S2/2, otherwise operating isochronically with the clock pulse S2 to control the electrodes S2E of the input serial chain, is suppressed. In the next successive clock pulse S1, which drives the electrodes S1E and S1EE, the bias charges GP are transferred from the transfer electrodes UN to the electrodes S1EE and the information charge IL, plus the bias charge G1, is fed into the first electrode S1E of the input serial chain. The next successive clock pulse S2/2 which drives the electrodes S2E of the input serial chain transfers the bias charge GP into the second electrode S2E through the last electrode S2E of the input serial chain and the mixed charge consisting of the information charge IL and the bias charge GI into the first electrode S2E of the input serial chain.

The bias charges GP are now pushed through the input serial chain with the clock pulse of the incoming information mixed charge in front of this and are destroyed with the assistance of a charge drain adjacent the operating voltage VDD. After the transfer of the charges carrying the information into the transfer electrode UNE of the parallel chains, the charges are further shifted in the parallel chain with the assistance of the clock pulse P1 driving the first storage locations of the parallel chains PF1–PF8.

The output serial chain of FIG. 3 is constructed in an analogous manner to the input serial chain of FIG. 1. The parallel field consisting of the channels PF1–PF8 is connected by way of a delivery electrode UGE with the output serial chain having the electrodes S1A consisting of polysilicon-2 and the electrodes S2A consisting of polysilicon-1. Thereby, the electrodes S1A are driven by way of the clock pulse S1, and the electrodes S2A are driven by way of the clock pulse S2. In a manner analogous to that of the input serial chain, an electrode UR is arranged which is connected by way of an electrode UC with a diffusion area ID, whereby a required bias charge GS is stored under the electrode UR. This bias charge GS is serially fed into the electrodes S2A and S1A of the output serial chain in the clock pulse of the removal of the information charges from the output serial chain to the output diffusion area AD.

In contrast to the input serial chain, it is necessary in the output serial chain to remove the bias charges GS fed into the output serial chain, in parallel from the output serial chain, before the delivery of the information charges from the parallel field with its parallel channels PF1–PF8 into the output serial chain having the electrodes S1A and S2A. This occurs with the assistance of a shift electrode V arranged parallel to the output serial chain and with an assigned diffusion area D, whereby the diffusion area is charged with the operating voltage VDD. The shift electrode V, like the delivery electrode UGE, is charged with the delivery clock pulse UG, with which the bias charges GS are removed from the output serial chain before the delivery of the charges characterizing the information from the parallel field having the parallel channels PF1–PF8, into the output serial chain.

In the embodiment illustrated in FIGS. 5-8, it is a matter of design of the input serial chain and the output serial chain of a charge transfer memory constructed in a simple double silicon technology in series-parallel-series organization in a so-called compressed arrangement. The charge transfer memory is, in this case, a four-phase charge transfer memory which is actuated in two-phase operation. In this operating mode, each second electrode (storage electrode) is driven isochronically with the neighboring shift electrode. Thereby, an element is defined as a charge transfer element which is composed of a storage electrode and a shift electrode. The charge transfer memory is thereby constructed in such a manner that the transfer or, respectively, delivery, is always undertaken from the same second storage electrodes of the serial input chain or the serial output chain. The delivery or, respectively, receiving electrode of the serial chain has two outputs or, respectively, inputs, to the parallel field, whereby the transfer or, respectively, delivery, occurs alternately by means of the one or other output. Therewith, two respective parallel chains in the parallel field PF1, PF2; PF3, PF4; etc., are assigned to each delivery or, respectively, receiving electrode of the serial input chain or serial output chain.

Figure 5:
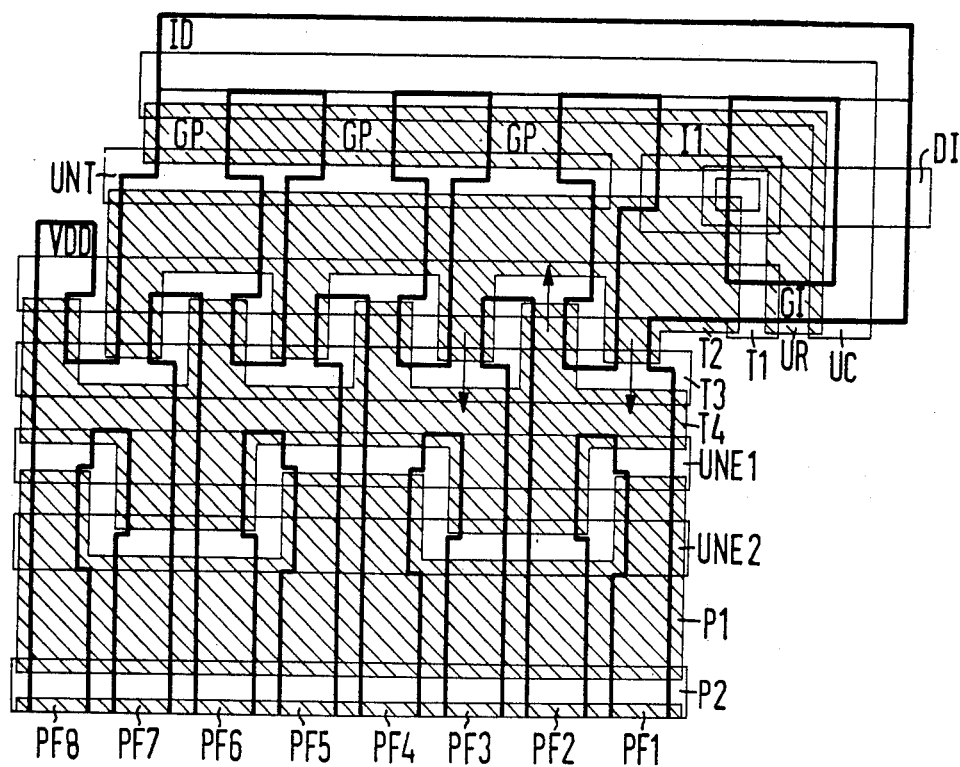
FIG. 5 is a schematic diagram of the design of an input serial chain for a charge transfer memory constructed in the simple double silicon technology, in so-called compressed series-parallel-series structure with a double transfer.
Figure 6:
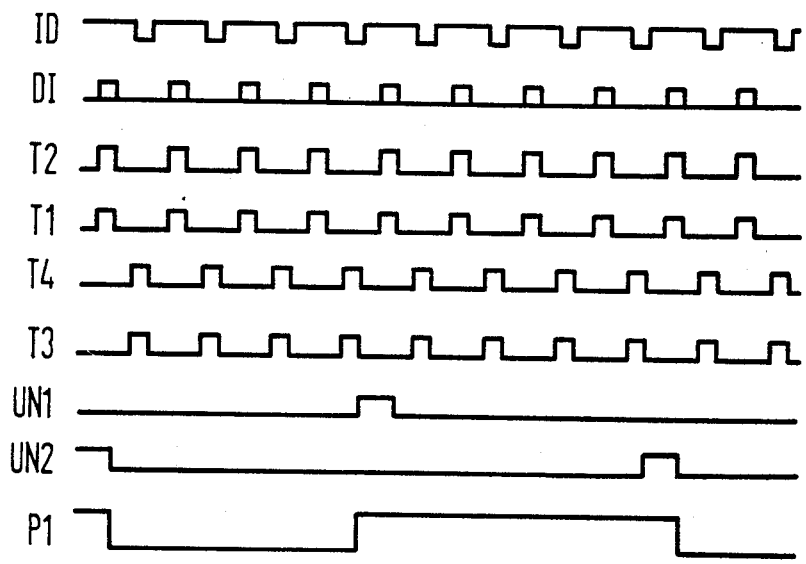
FIG. 6 is a pulse diagram for the operation of the input serial chain of FIG. 5.

In the input serial chain illustrated in FIG. 5, the storage areas lie beneath the electrodes T4 and T2 consisting of polysilicon-1 and having the drive clock pulses TT4, TT2 and the shift areas lie under the polysilicon-2 electrodes T1 and T3 having the drive clock pulses TT1, TT3. Two transfer electrodes UNE1 and UNE2 having their respectively appertaining parallel channels PF1, PF2 or, respectively, PF3, PF4, etc., are respectively assigned to the electrode P4 delivering into the parallel chain. The transfer electrodes UNE1 and UNE2 are driven with clock pulses UN1 and UN2, which also drive the electrode UNT feeding in the bias charges GP in common. A serpentine or meander like course of the charge path occurs by means of the form of the electrodes T1–T4 of the serial input chain. The function of the input serial chain is analogous to the function of the input serial chain of FIG. 1.

Figure 7:
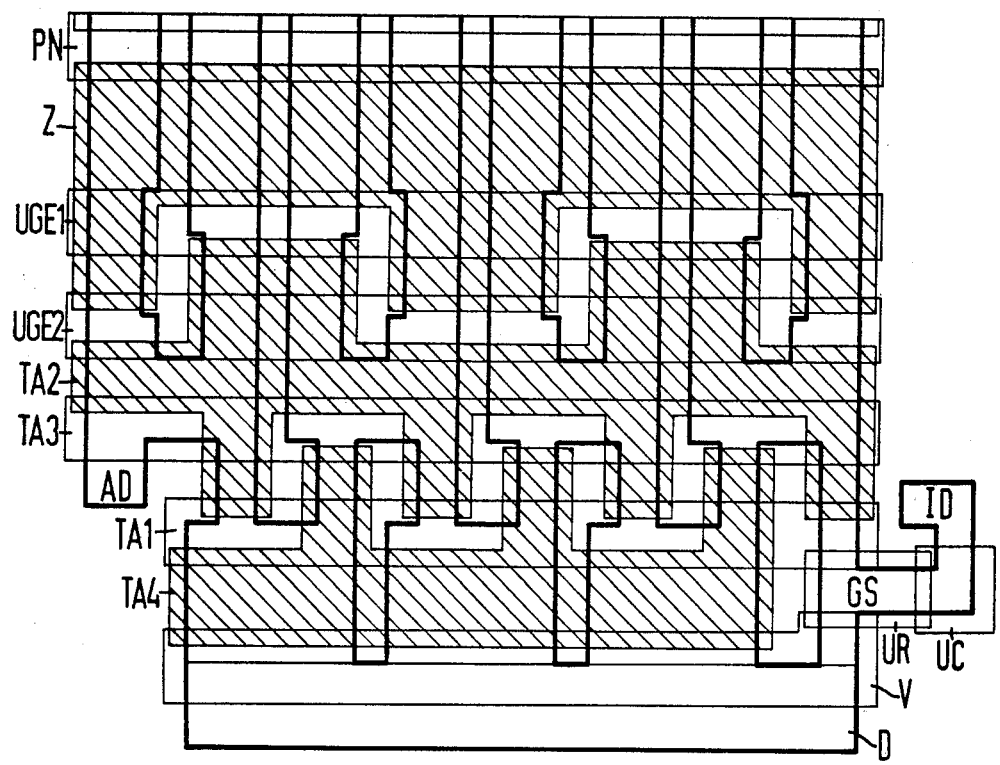
FIG. 7 is a schematic illustration of the design of an output serial chain for a charge transfer memory, constructed in simple double silicon technology, and in compressed series-parallel-series construction with a double transfer.

The output serial chain of FIG. 7 corresponds in operation to the input serial chain of FIG. 5. The four control electrodes of the output chain TA1–TA4 are likewise driven by way of the clock pulses TT1–TT4, whereby here, also, the storage areas again lie beneath the polysilicon-1 electrodes TA4 and TA2 and the shift areas lie under the polysilicon-2 electrodes TA1 and TA3. The electrodes TA4 and TA3 are again charged in common with the clock pulses TT4 and TT3; and the same holds true for the electrodes TA1 and TA2 with their clock pulses TT1 and TT2. The output serial chain is connected with the assigned parallel chain by way of the delivery electrodes UGE1 and UGE2 having the control clock pulses UG1, UG2 which are connected to the last storage electrodes TN of the parallel chains by way of an intermediate storage electrode Z. The intermediate storage electrode is provided with a suitable voltage VCC and stores the information charges for delivery into the actual output serial chain.

Figure 8:
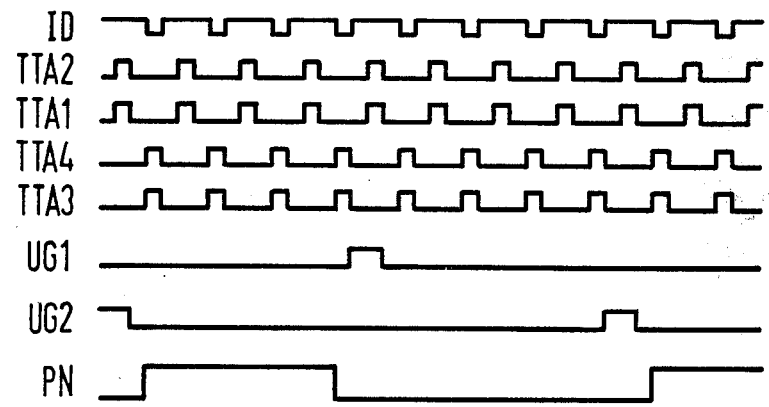
FIG. 8 is a pulse diagram for the operation of the output serial chain of FIG. 7.

In a manner analogous to the output serial chain of FIG. 3, the output serial chain of FIG. 8 is provided with a shift electrode V which is driven in common with the clock pulses UG1 and UG2. A diffusion area D, which lies at an operating voltage VDD, is allocated to the shift electrode V, whereby the shift electrode again serves to remove the bias charges GS fed into the output serial chain before the renewed transfer of information charges from the parallel chain. As in the output serial chain of FIG. 3, the output serial chain of FIG. 7 is filled with the bias charges GS in the clock pulse of the read-out of the information charges transferred from the parallel chain and to the output serial chain, whereby a complete bias charge operation also occurs for the output serial chain.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a series-parallel-series charge transfer memory of the type having a read-in chain of a plurality of first and second alternately arranged charge transfer elements, a plurality of parallel charge transfer devices coupled to receive information charges from the charge transfer elements of the read-in chain, and a read-out chain of a plurality of third and fourth alternately arranged charge transfer elements coupled to receive information charges from the parallel charge transfer devices, the improvement comprising:

a first circuit arrangement assigned to the read-in chain and operable to store bias charges and deliver the bias charges to the read-in chain after information charge transfer to the parallel charge transfer devices; and a second circuit arrangement assigned to the read-out chain and operable to remove bias charges from the read-out chain prior to receipt of information charges from the parallel charge transfer devices.

2. The improved memory of chain 1, wherein the read-in and read-out chains are constructed in double silicon technology having implanted shift areas and operating in two-phase operation, said charge transfer elements of said read-in and read-out chains constructed to provide a zig-zag course of the charge path, and wherein:

said read-in chain includes electrodes; said first circuit arrangement comprises a chain of charge transfer elements arranged in parallel to the charge transfer elements of said read-in chain and including electrodes individually linked with the electrodes of the read-in chain, and pre-connected storage electrodes for filling the charge transfer elements with bias charges from a charge source;

said read-out chain comprising electrodes; and
said second circuit arrangement comprises a plurality of charge transfer elements connected to be driven in common with the transfer electrodes between the read-in chain and the plurality of charge transfer devices.

3. The improved memory of claim 2, wherein said plurality of charge transfer elements of said second circuit arrangement comprises:
shift electrodes arranged parallel to the electrodes of said read-out chain and individually linked with the electrodes of said read-out chain, and connected to a charge sink.

4. The improved memory of chain 1, constructed as a four-phase charge transfer memory in simple double silicon technology, wherein:
each of said read-in and read-out chains comprises first and second storage electrodes of the charge transfer elements, each of said storage electrodes being in the form of two bands having a tooth comb structure and comprising silicon-1 and silicon-2, respectively and extending parallel to one another with the comb teeth interengaging, and defining the areas of the read-in and read-out chains, with the band-shaped first and second shift electrodes extending parallel to one another in the tooth area so that a meander-like course of the charge path occurs, and in which the charges characterizing the information are always read out of the read-in chain into the parallel charge transfer devices and read-out of the parallel charge transfer devices into the read-out chain by way of the same storage electrodes; and
said first circuit arrangement comprises a parallel chain of charge transfer devices including a plurality of shift electrodes arranged parallel to the first memory electrodes of the read-in chain and individually linked thereto, and having a pre-connected storage electrode connected to receive charges from a charge source; and
said first circuit arrangement further comprises transfer electrodes connected to be driven in common with the transfer electrodes between the read-in chain and said parallel charge transfer devices.

5. The improved memory of claim 4, wherein:
said second circuit arrangement comprises a plurality of shift electrodes arranged parallel to the second storage electrodes of the read-out chain and individually linked thereto, and connected with a charge sink.

* * * * *